(12) United States Patent
Shin et al.

(10) Patent No.: US 10,263,598 B2
(45) Date of Patent: Apr. 16, 2019

(54) ACOUSTIC RESONATOR AND METHOD OF MANUFACTURING THE SAME

(71) Applicant: Samsung Electro-Mechanics Co., Ltd., Suwon-si (KR)

(72) Inventors: Jea Shik Shin, Suwon-si (KR); Sang Uk Son, Suwon-si (KR); Yeong Gyu Lee, Suwon-si (KR); Moon Chul Lee, Suwon-si (KR); Ho Soo Park, Suwon-si (KR); Duck Hwan Kim, Suwon-si (KR); Chul Soo Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 308 days.

(21) Appl. No.: 14/925,230

(22) Filed: Oct. 28, 2015

(65) Prior Publication Data

US 2016/0163954 A1 Jun. 9, 2016

(30) Foreign Application Priority Data

Dec. 8, 2014 (KR) ........................ 10-2014-0175014

(51) Int. Cl.
*H01L 41/047* (2006.01)
*H03H 9/17* (2006.01)
*H03H 3/02* (2006.01)

(52) U.S. Cl.
CPC .............. *H03H 9/173* (2013.01); *H03H 3/02* (2013.01); *H03H 2003/021* (2013.01)

(58) Field of Classification Search
CPC .... H03H 9/173; H03H 3/02; H03H 2003/021; H03H 9/174; H03H 9/177

USPC .......................................................... 310/321
See application file for complete search history.

(56) References Cited

U.S. PATENT DOCUMENTS

| 8,350,445 | B1 | 1/2013 | Shirakawa et al. |
| 2001/0045793 | A1* | 11/2001 | Misu ........................ H03H 3/04 310/364 |
| 2005/0184627 | A1* | 8/2005 | Sano ..................... H01L 42/316 310/363 |
| 2005/0248232 | A1* | 11/2005 | Itaya ........................ H03H 3/02 310/320 |
| 2006/0179642 | A1* | 8/2006 | Kawamura .............. H03H 3/02 29/594 |
| 2007/0013463 | A1 | 1/2007 | Kim et al. |

(Continued)

FOREIGN PATENT DOCUMENTS

| JP | 2005-318420 A | 11/2005 |
| JP | 2007-28612 A | 2/2007 |

(Continued)

OTHER PUBLICATIONS

Korean Office Action dated Oct. 25, 2018 in corresponding Korean Patent Application No. 10-2014-0175014 (6 pages in English, 5 pages in Korean).

*Primary Examiner* — Bryan P Gordon
(74) *Attorney, Agent, or Firm* — NSIP Law (57) ABSTRACT

An acoustic resonator and a method of manufacturing the same are provided. The acoustic resonator includes a resonance part including a first electrode, a second electrode, and a piezoelectric layer disposed between the first and second electrodes; and a substrate disposed below the resonance part. The piezoelectric layer is disposed on a flat surface of the first electrode.

9 Claims, 6 Drawing Sheets

(56) References Cited

U.S. PATENT DOCUMENTS

| | | | |
|---|---|---|---|
| 2008/0042780 A1* | 2/2008 | Lee | H03H 3/02 333/187 |
| 2009/0173516 A1 | 7/2009 | Burke et al. | |
| 2010/0327697 A1* | 12/2010 | Choy | H03H 9/02118 310/335 |
| 2011/0298564 A1* | 12/2011 | Iwashita | H03H 3/02 333/187 |
| 2012/0218059 A1* | 8/2012 | Burak | H03H 9/132 333/191 |
| 2014/0203686 A1 | 7/2014 | Song et al. | |
| 2016/0204761 A1* | 7/2016 | Lee | H03H 3/02 333/187 |

FOREIGN PATENT DOCUMENTS

| | | |
|---|---|---|
| JP | 2008-236795 A | 10/2008 |
| KR | 10-2014-0094283 A | 7/2014 |

* cited by examiner

ACOUSTIC RESONATOR AND METHOD OF MANUFACTURING THE SAME

CROSS-REFERENCE TO RELATED APPLICATION

This application claims the benefit under 35 USC 119(a) of Korean Patent Application No. 10-2014-0175014 filed on Dec. 8, 2014, in the Korean Intellectual Property Office, the entire disclosure of which is incorporated herein by reference for all purposes.

BACKGROUND

1. Field

The present disclosure relates to an acoustic resonator and a method of manufacturing the same.

2. Description of Related Art

In accordance with the trend for the miniaturization of wireless communications devices, there exists a demand to further miniaturize radio frequency (RF) components, such as a bulk acoustic wave (BAW) resonator type filter that uses semiconductor thin film wafer manufacturing technology.

A bulk acoustic wave (BAW) resonator is a thin film-type element having a structure formed through depositing a piezoelectric dielectric material on a silicon wafer, a semiconductor substrate, using piezoelectric characteristics of the piezoelectric dielectric material. A BAW resonator is capable of generating resonance through the structure, and is commonly used as a filter.

Such a bulk acoustic wave BAW resonator may be used in fields such as small, light filters, oscillators, resonance elements, and acoustic resonance mass sensors, of mobile communications devices, chemical and biological devices, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator including a resonance part comprising a first electrode, a second electrode, and a piezoelectric layer disposed between the first and second electrodes, and a substrate disposed below the resonance part, and the piezoelectric layer is disposed on a flat surface of the first electrode.

An area of the piezoelectric layer may be smaller than that of the flat surface of the first electrode.

The general aspect of the acoustic resonator further includes a spacing layer disposed on an inclined surface formed by the piezoelectric layer and the first electrode.

The spacing layer may provide a separation between the first electrode and the second electrode.

The spacing layer may include an air cavity that separates the first electrode from the second electrode.

The spacing layer may be filled with an insulating material.

The insulating material may include at least one selected from the group consisting of $SiO_2$, silicon, $Si_3N_4$, and AlN.

The general aspect of the acoustic resonator further includes at least one frame structure protruding outwardly from the second electrode.

In another general aspect, a method of manufacturing an acoustic resonator involves forming a conductive layer on a substrate in order to form a first electrode, forming a piezoelectric layer on the conductive layer, removing a portion of the piezoelectric layer, and forming the first electrode by removing a portion of the conductive layer.

The general aspect of the method may further involve, after the forming of the first electrode, forming a sacrificial layer on an inclined surface formed by the first electrode and the piezoelectric layer.

The general aspect of the method may further involve, after the forming of the sacrificial layer, forming a second electrode on the piezoelectric layer and the sacrificial layer.

The general aspect of the method may further involve, after the forming of the second electrode, forming an air cavity by removing the sacrificial layer.

The portion of the piezoelectric layer, other than a portion of the piezoelectric layer formed on a flat surface of the first electrode, may be removed.

The portion of the piezoelectric layer may be removed to allow the first electrode to be exposed outside of the piezoelectric layer.

The sacrificial layer include molybdenum (Mo).

The forming of the sacrificial layer may involve applying an insulating material to the inclined surface, and the insulating material may include at least one selected from the group consisting of $SiO_2$, silicon, $Si_3N_4$, and AlN.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In the drawings, the shapes and dimensions of elements may be exaggerated for clarity, and the same reference numerals will be used throughout to designate the same or like elements.

In addition, terms with respect to directions will be defined. A horizontal direction refers to a direction that is in parallel with an upper surface or a lower surface of a substrate.

A BAW resonator is capable of generating resonance through the structure, and may be used in fields such as small, light filters, oscillators, resonance elements, and acoustic resonance mass sensors, of mobile communications devices, chemical and biological devices, and the like. Given the wide applicability of such a BAW resonator, research into structural shapes and functions for improving the characteristics and performance of BAW resonators has been conducted.

An aspect of the present disclosure may provide an acoustic resonator of which an overall level of performance may be improved by improving crystallinity of a piezoelectric layer.

Figure 1:
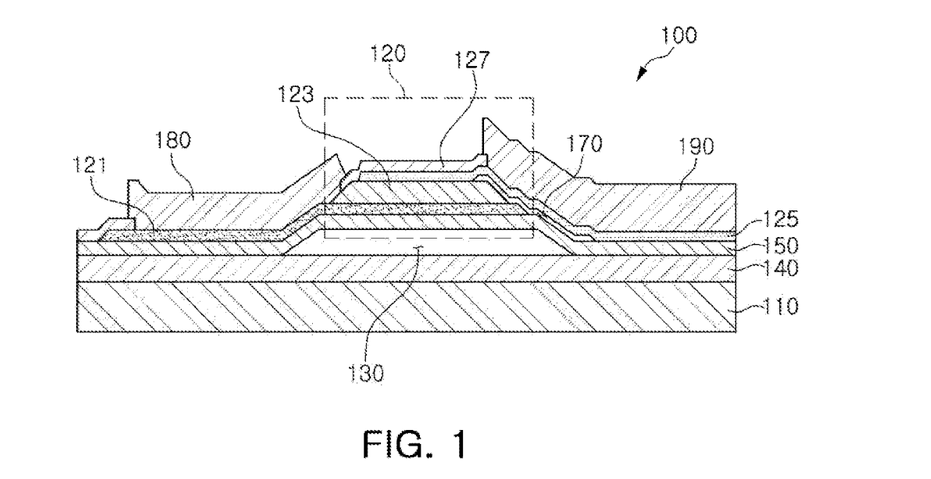
FIG. 1 is a cross-sectional view of an example of an acoustic resonator according to the present disclosure.

FIG. 1 illustrates a cross-sectional view of an example of an acoustic resonator according to the present disclosure.

Referring to FIG. 1, an acoustic resonator 100 includes a substrate 110 and a resonance part 120.

In this example, an air gap 130 is formed between the substrate 110 and the resonance part 120, and the resonance part 120 is formed on a membrane layer 150 so as to be spaced apart from the substrate 110 through the air gap 130.

The substrate 110 may be a silicon substrate or a silicon-on-insulator (SOI) type substrate.

The resonance part 120 includes a first electrode 121, a piezoelectric layer 123, and a second electrode 125. The resonance part 120 may be formed by sequentially stacking the first electrode 121, the piezoelectric layer 123, and the second electrode 125 from the bottom. When this method is used to form the resonance part 120, the piezoelectric layer 123 is disposed between the first electrode 121 and the second electrode 125.

Since the resonance part 120 is formed on the membrane layer 150, the membrane layer 150, the first electrode 121, the piezoelectric layer 123, and the second electrode 125 are sequentially formed on the substrate 110.

The resonance part 120 resonates the piezoelectric layer 123 depending on signals applied to the first electrode 121 and the second electrode 125 to generate a resonance frequency and a semi-resonance frequency.

The first electrode 121 and the second electrode 125 may be formed of a metal such as gold, molybdenum, ruthenium, aluminum, platinum, titanium, tungsten, palladium, chromium, or nickel.

The resonance part 120 uses an acoustic wave of the piezoelectric layer 123. For example, when a signal is applied to the first electrode 121 and the second electrode 125, mechanical vibrations are generated in a thickness direction of the piezoelectric layer 123, such that an acoustic wave is generated.

In this example, the piezoelectric layer 123 may contain zinc oxide (ZnO), aluminum nitride (AlN), quartz, and the like.

A resonance phenomenon of the piezoelectric layer 123 is generated when ½ of a wavelength of the applied signal coincides with a thickness of the piezoelectric layer 123. When the resonance phenomenon is generated, electrical impedance is rapidly changed. Therefore, the acoustic resonator according to the present example may be used as a filter that may select a frequency.

The resonance frequency is determined by the thickness of the piezoelectric layer 123, the first and second electrodes 121 and 125 enclosing the piezoelectric layer 123, a unique elastic wave velocity of the piezoelectric layer 123, and the like.

For example, as the thickness of the piezoelectric layer 123 is decreased, the resonance frequency is increased.

The piezoelectric layer 123 according to the present example may be formed only on a flat surface of the first electrode 121. Therefore, in this example, the piezoelectric layer 123 does not protrude outward from the first electrode 121 in a horizontal direction, but may be disposed only on a portion of the flat surface of the first electrode 121. Therefore, an area of the piezoelectric layer 123 may be smaller than that of the flat surface of the first electrode 121.

In a case in which the piezoelectric layer 123 is formed on an inclined surface of the first electrode 121 or the membrane layer 150, crystallinity of the piezoelectric layer 123 may be decreased due to surface roughness of the inclined surface, or the like.

However, since the piezoelectric layer 123 according to the present example is formed on the flat surface rather than on the inclined surface, the entire piezoelectric layer 123 may be firmly deposited on the first electrode 121. Therefore, adhesion between the piezoelectric layer 123 and the first electrode may be secured, and the crystallinity of the piezoelectric layer 123 may be secured.

In addition, since the piezoelectric layer 123 is only disposed in the resonance part 120, and not outside of the resonance part 120, a phenomenon that the acoustic wave formed by the piezoelectric layer 123 is leaked to the outside of the resonance part 120 may be significantly suppressed.

Referring to FIG. 1, the resonance part 120 further includes a protection layer 127. The protection layer 127 is formed on the second electrode 125 to prevent the second electrode 125 from being exposed to an external environment.

The first electrode 121 and the second electrode 125 extend to the outside of the piezoelectric layer 123, and a first connection electrode 180 and a second connection electrode 190 connect to extended portions of the first electrode 121 and the second electrode 125, respectively.

The first connection electrode 180 and the second connection electrode 190 may be provided in order to check characteristics of a resonator and a filter and perform required frequency trimming. However, the first and second connection electrodes 180 and 190 are not limited thereto.

The resonance part 120 is disposed to be spaced apart from the substrate 110 through the air gap 130 in order to improve a quality factor.

In this example, the air gap 130 is formed between the resonance part 120 and the substrate 110 to prevent the acoustic wave generated in the piezoelectric layer 123 from being affected by the substrate 110.

In addition, reflection characteristics of the acoustic wave generated in the resonance part 120 are improved through the air gap 130. Since impedance of the air gap 130, which is an empty space, is close to infinity, the acoustic wave remains in the resonance part 120 without being lost by the air gap 130.

Therefore, loss of the acoustic wave in a longitudinal direction may be decreased through the air gap 130, whereby a quality factor value of the resonance part 120 may be improved.

In addition, in the acoustic resonator 100 according to the present example, the piezoelectric layer 123 is formed on one surface of the first electrode 121 and does not protrude outward from the first electrode 121.

Therefore, the exterior of the piezoelectric layer 123 is formed within an upper surface of the first electrode 121, and the exterior of the first electrode 121 further protrudes from the exterior of the piezoelectric layer 123 by a predetermined distance in the horizontal direction.

Therefore, a spacing layer 170 is formed between a distal end of the first electrode 121 exposed to the outside of the piezoelectric layer 123 and the second electrode 125.

The spacing layer 170 prevents the distal end of the first electrode 121 and the second electrode 125 from contacting each other to be electrically connected to each other. Therefore, the spacing layer 170 encloses the entire distal end of the first electrode 121, and partially encloses the piezoelectric layer 123 or the membrane layer 150, if necessary.

For example, the spacing layer 170 is formed along a circumference of the resonance part 120.

In addition, the spacing layer 170 suppresses parasitic capacitance from being generated between the first and second electrodes 121 and 125. To this end, in this example, the spacing layer 170 may be formed as an air cavity having low permittivity.

In addition, the spacing layer 170 is formed on an inclined surface formed by the piezoelectric layer 123, the first electrode 121, and the membrane layer 150. Therefore, the piezoelectric layer 123 is not disposed on the above-mentioned inclined surface, but may be disposed only on the flat surface of the first electrode 121, and not on the substrate 110 outside of the resonance part 120.

In this case, reflection of the acoustic wave may be significantly increased at the exterior of the piezoelectric layer 123, such that leakage of the acoustic wave may be significantly decreased.

Next, an example of a method of manufacturing an acoustic resonator will be described.

FIGS. 2 through 6 are views illustrating an example of a method of manufacturing an acoustic resonator according to the present disclosure.

Figure 2:
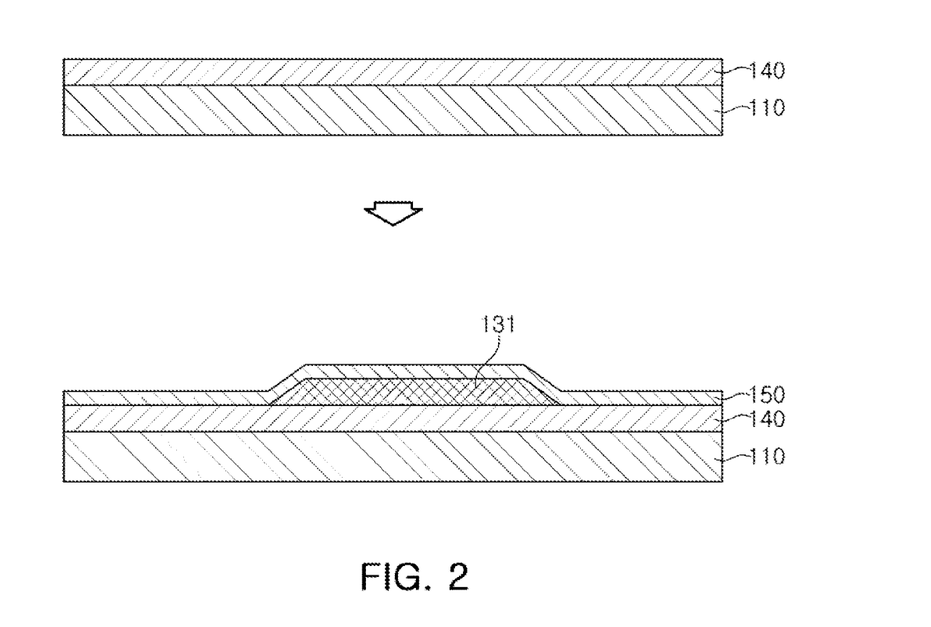
FIGS. 2 through 6 are views illustrating an example of a method of manufacturing an acoustic resonator according to the present disclosure.

First, referring to FIG. 2, an etching stop layer 140 is formed on the substrate 110.

The etching stop layer 140 serves to protect the substrate 110 when a sacrificial layer is removed in order to form the air gap 130. The etching stop layer 140 may be formed of a silicon oxide layer, a silicon nitride layer, or the like, but the material for forming the etching stop layer 140 is not limited thereto.

Then, a first sacrificial layer 131 is formed on the etching stop layer 140.

The first sacrificial layer 131 is removed through a subsequent etching process to form the air gap 130 illustrated in FIG. 1. The first sacrificial layer 131 may be formed of polysilicon, polymer, or the like.

Then, the membrane layer 150 is formed on the first sacrificial layer 131. The membrane layer 150 is positioned on the air gap 130 to serve to maintain a shape of the air gap 130 and support a structure of the resonance part 120.

Figure 3:
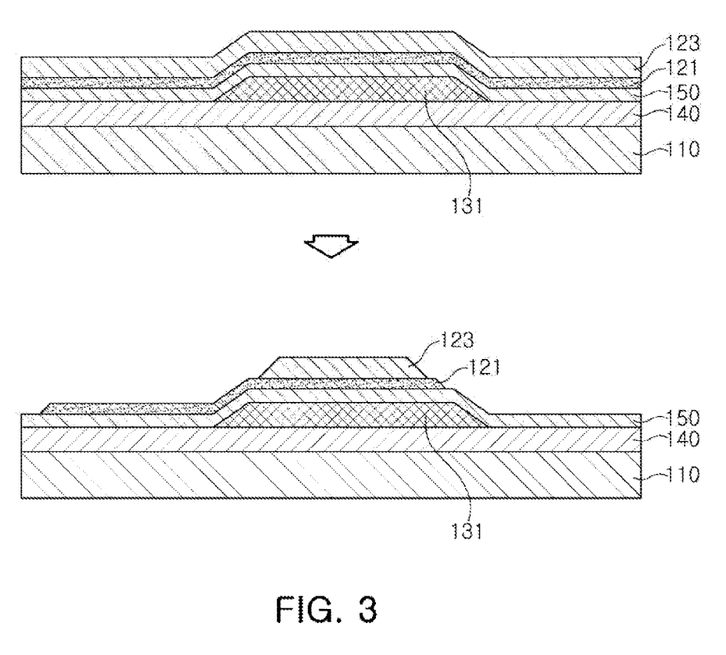

Then, as illustrated in FIG. 3, the first electrode 121 and the piezoelectric layer 123 are sequentially formed on the membrane layer 150.

The first electrode 121 is formed by depositing a conductive layer on the membrane layer 150. Likewise, the piezoelectric layer 123 is formed by depositing a piezoelectric material on the first electrode 121.

In the present example, the first electrode 121 may be formed of molybdenum (Mo). However, a material of the first electrode 121 is not limited thereto. That is, various metals such as gold, ruthenium, aluminum, platinum, titanium, tungsten, palladium, chromium, or nickel may be used as a material of the first electrode 121.

In the present example, the piezoelectric layer 123 may be formed of aluminum nitride (AlN). However, a material of the piezoelectric layer 123 is not limited thereto. That is, various piezoelectric materials such as zinc oxide (ZnO) or quartz may be used as a material of the piezoelectric layer 123.

Meanwhile, in the method of manufacturing an acoustic resonator according to the present example, the piezoelectric layer 123 is directly formed on the first electrode 121 without forming a pattern on the first electrode 121 after the first electrode 121, which is a lower electrode, is formed.

Therefore, the first electrode 121 and the piezoelectric layer 123 are successively deposited while being maintained in a vacuum state within a vacuum chamber (not illustrated), such that the first electrode 121 and the piezoelectric layer 123 are easily manufactured and deposition reliability of the first electrode 121 and the piezoelectric layer 123 is increased.

In addition, in the method of manufacturing an acoustic resonator according to the present example, since the first electrode 121 is not etched before the piezoelectric layer 123 is deposited, an etched surface may not be present on the first electrode 121 in an operation of forming the piezoelectric layer 123.

The etched surface may be relatively rougher than other surfaces. Therefore, in a case in which the etched surface is formed on the first electrode 121, the piezoelectric layer 123 may not be firmly deposited on the etched surface of the first electrode 121, and thus, the crystallinity of the piezoelectric layer 123 may be decreased.

However, in the method of manufacturing an acoustic resonator according to the present example, the piezoelectric layer 123 is directly formed on the first electrode 121 without etching the first electrode 121, as described above. Therefore, since an etched surface is not present on the first electrode 121, the piezoelectric layer 123 may be deposited firmly on the first electrode 121, and the crystallinity of the piezoelectric layer 123 may be increased.

Then, the piezoelectric layer 123 and the first electrode 121 are partially removed. In this operation, after the piezoelectric layer 123 is partially removed through etching, the first electrode 121 is partially removed again through etching to form required patterns.

In this example, each of the first electrode 121 and the piezoelectric layer 123 may be formed as required patterns by depositing a photoresist on a conductive layer (or a piezoelectric layer), patterning the photoresist through a photolithography process, and removing unnecessary portions using the patterned photoresist as a mask.

Through the present operation, the piezoelectric layer 123 only remains on the first electrode 121, and the first electrode 121 further protrudes to the surrounding of the piezoelectric layer 123.

Figure 4:
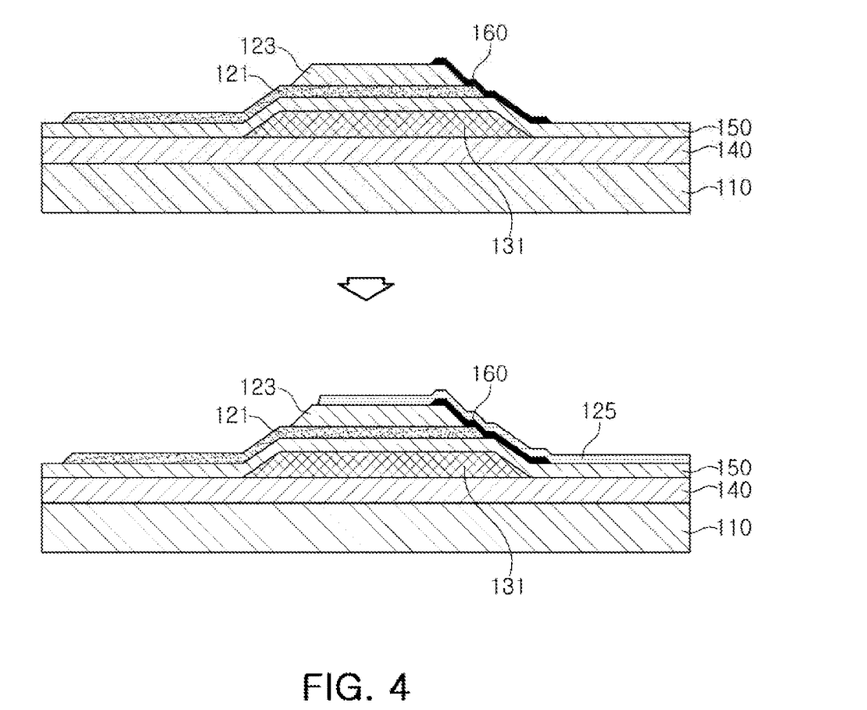

Then, as illustrated in FIG. 4, a second sacrificial layer 160 for forming the spacing layer 170 (see FIG. 1) is formed on the etched surfaces of the piezoelectric layer 123 and the first electrode 121. In the present operation, the second sacrificial layer 160 may be an insulating layer (or a conductive layer) covering the etched surfaces of the piezoelectric layer 123 and the first electrode 121. In addition, the second sacrificial layer 160 may also cover an inclined surface of the membrane layer 150.

In a case in which the second sacrificial layer 160 is formed of the conductive layer, an insulating layer may be interposed between the first electrode and the second sacrificial layer 160.

The second sacrificial layer 160 is formed on the inclined surface formed by the piezoelectric layer 123, the first electrode 121, and the membrane layer 150. In addition, in this example, the second sacrificial layer 160 is formed only on the inclined surface to which the distal end of the first electrode 121 is exposed, and is not formed on an inclined surface disposed at the opposite of the inclined surface.

A distance may be secured between the first and second electrodes 121 and 125 by the second sacrificial layer, such that a contact between the first and second electrodes 121 and 125 may be prevented. That is, the first electrode 121 and the second electrode 125 are physically separated from each other by the second sacrificial layer, and subsequently by the spacing layer 170. In addition, finally, the second sacrificial layer 160 may be formed as, or converted into, the spacing layer 170 including air as illustrated in FIG. 1, such that generation of parasitic capacitance between the first and second electrodes 121 and 125 may be suppressed.

The second sacrificial layer 160 may be formed of molybdenum or silica ($SiO_2$). However, a material of the second sacrificial layer 160 is not limited thereto.

Next, the second electrode 125 is formed.

The second electrode 125 may be formed as required patterns by forming a conductive layer on the piezoelectric layer 123, the first electrode 121, and the second sacrificial layer 160, depositing a photo-resist on the conductive layer, patterning the photo-resist by a photolithography process, and then removing unnecessary portions using the patterned photo-resist as a mask.

In the present example, the second electrode 125 may be formed of ruthenium (Ru). However, a material of the second electrode 125 is not limited thereto. That is, various metals such as gold, molybdenum, aluminum, platinum, titanium, tungsten, palladium, chromium, or nickel, may be used as a material of the second electrode 125.

Figure 5:
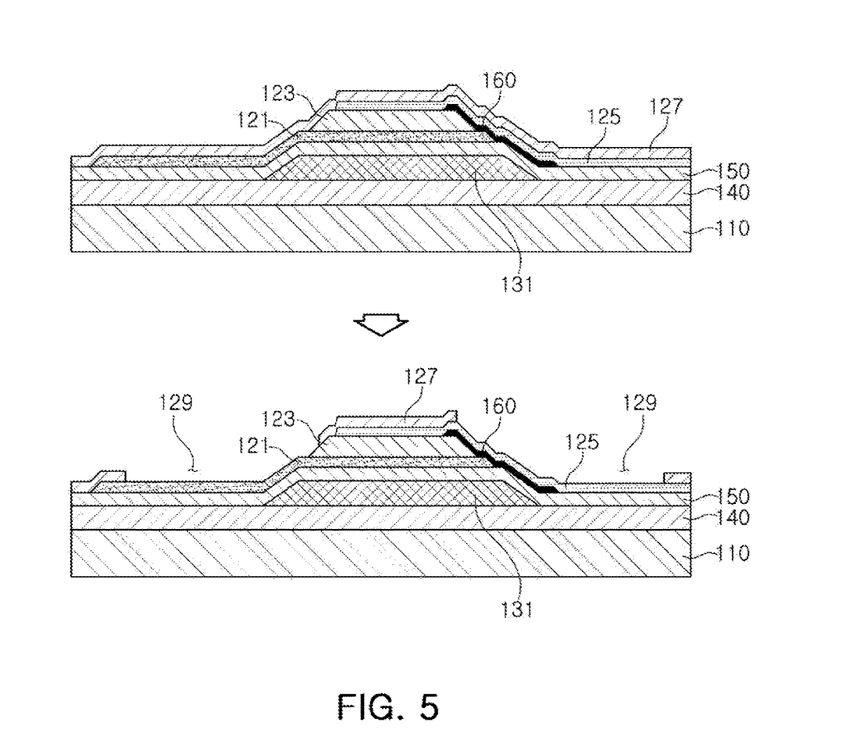

Next, as illustrated in FIG. 5, the protection layer 127 is formed on the second electrode 125 and the piezoelectric layer 123.

The protection layer 127 may be formed of an insulating material. The insulating material may include a silicon oxide based material, a silicon nitride based material, and an aluminum nitride based material.

Figure 6:
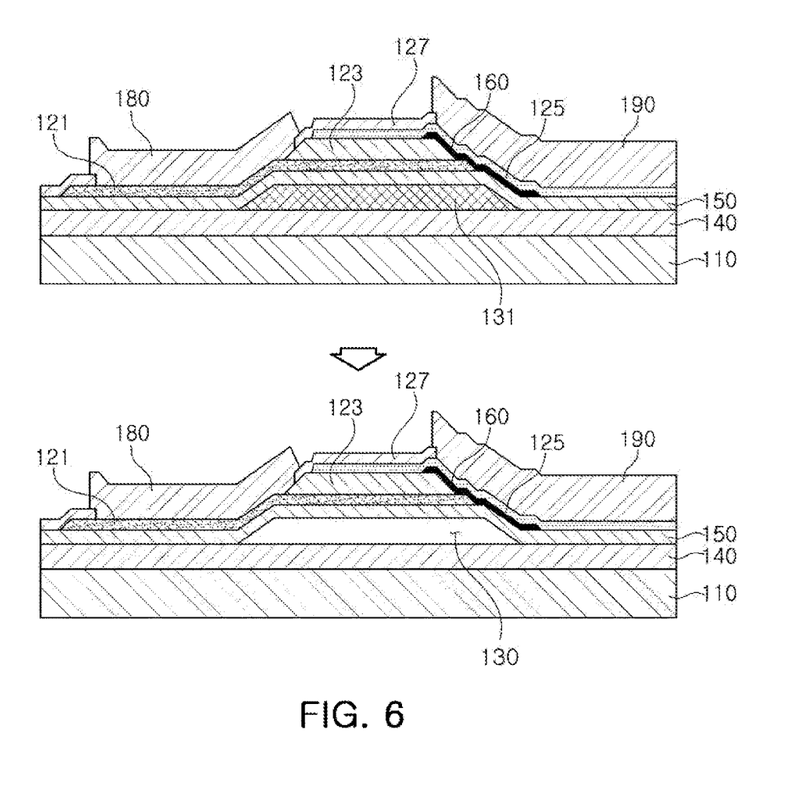

Then, the connection electrodes 180 and 190 illustrated in FIG. 6 are formed. The connection electrodes 180 and 190 may be used for frequency trimming, and may be bonded to the first and second electrodes 121 and 125, respectively, while penetrating through the protection layer 127.

Referring to FIGS. 5 and 6, The first connection electrode 180 is formed by partially removing the protection layer 127 through etching to form a hole 129 and expose the first electrode 121 externally and then depositing gold (Au), copper (Cu), or the like, on the first electrode 121.

Likewise, the second connection electrode 190 is formed by partially removing the protection layer 127 through etching to form a hole 129 and expose the second electrode 125 externally and then depositing gold (Au), copper (Cu), or the like, on the second electrode 125, as illustrated in FIG. 6.

Then, the air gap 130 may be formed after the connection electrodes 180 and 190 are used to check characteristics of the resonance part 120 and the filter and perform required frequency trimming.

The air gap 130 may be formed by removing the first sacrificial layer 131, as illustrated in FIG. 6, and accordingly, the resonance part 120 according to the present example may be completed. The first sacrificial layer 131 may be removed through dry etching. However, a method of removing the sacrificial layer is not limited thereto.

Then, the second sacrificial layer 160 is removed in order to form the spacing layer 170.

The second sacrificial layer 160 may be removed together with the first sacrificial layer 131, depending on a material thereof. For example, in a case in which the first sacrificial layer 131 is formed of polysilicon and the second sacrificial layer 160 is formed of molybdenum, the first and second sacrificial layers 131 and 160 may be removed through XeF2. In this case, the first and second sacrificial layers 131 and 160 may be removed together by a single process. However, a method of removing the first and second sacrificial layers 131 and 160 is not limited thereto.

After the second sacrificial layer 160 is removed, an empty space (or an air cavity) is formed as the spacing layer 170, and accordingly, the acoustic resonator illustrated in FIG. 1 is obtained.

The spacing layer 170 formed of the air cavity allows the first and second electrodes 121 and 125 to be spaced apart from each other to prevent a contact between the first and second electrodes 121 and 125, and suppresses generation of parasitic capacitance between the first and second electrodes 121 and 125 due to low permittivity.

As described above, in the acoustic resonator according to the present example, the spacing layer 170 is formed of air having a low dielectric constant, whereby parasitic capacitance may be significantly decreased.

Meanwhile, the acoustic resonator and the manufacturing method thereof according to the present example are not limited to the above-mentioned embodiment, but may be variously modified.

Figure 7:
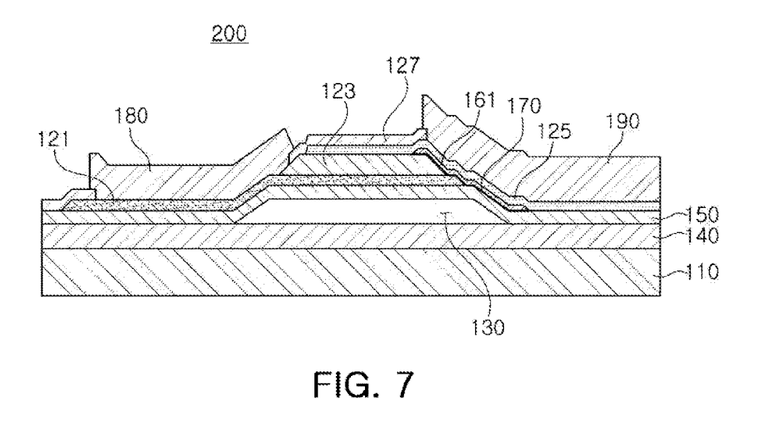
FIG. 7 is a schematic cross-sectional view of another example of an acoustic resonator according to the present disclosure.

FIG. 7 illustrates a cross-sectional view of another example of an acoustic resonator according to the present disclosure.

Referring to FIG. 7, in an acoustic resonator 200 illustrated therein, the spacing layer 170 is not formed as an empty space, but may be filled with an insulating material 161. Therefore, the first and second electrodes 121 and 125 are spaced apart from each other by the insulating material 161, such that insulation between the first and second electrodes 121 and 125 may be secured.

The insulating material may be a material having a low dielectric constant. For example, the insulating material 161 may be $SiO_2$, silicon, $Si_3N_4$, AlN, or the like, but is not limited thereto.

In a case in which the insulating material 161 is filled in the spacing layer 170, as described above, parasitic capacitance may be slightly increased as compared with in a case in which the spacing layer 170 is formed as the empty space, but it may be easy to form the spacing layer 170.

In addition, the spacing layer 170 according to the present example may be formed by applying the above-mentioned insulating material 160 instead of the second sacrificial layer 160 (see FIG. 4) in the method of manufacturing an acoustic resonator.

Figure 8:
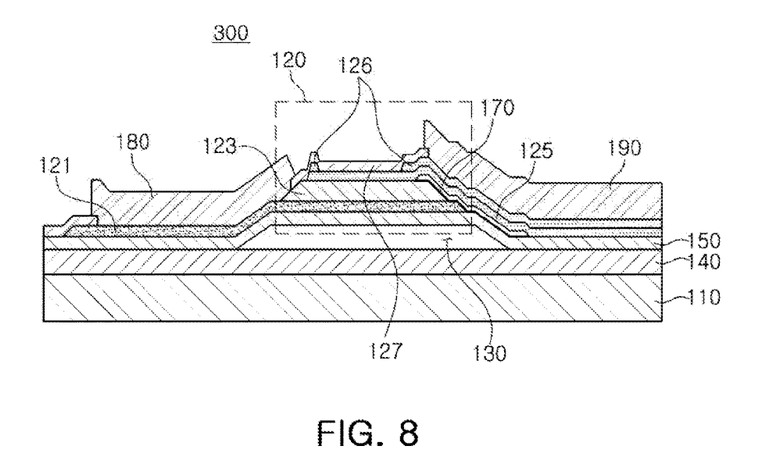
FIG. 8 is a schematic cross-sectional view of another example of an acoustic resonator according to the present disclosure.

FIG. 8 illustrates a cross-sectional view of another example of an acoustic resonator according to the present disclosure.

Referring to FIG. 8, an acoustic resonator 300 include a frame structure 126.

The frame structure 126 is formed as a protrusion or a predetermined region protruding from the second electrode 125.

In a case in which the acoustic resonator 300 includes the frame structure 126 as described above, the acoustic wave generated in the resonance part 120 is reflected on the frame structure, whereby leakage of acoustic energy may be significantly decreased.

The frame structure 126 may be additionally formed at the time of forming the second electrode 125. For example, after the second electrode 125 is formed, the frame structure 126 may be formed on the second electrode 125 using the same material as that of the second electrode 125.

As set forth above, in the acoustic resonator and the manufacturing method thereof according to examples, the spacing layer may allow the first and second electrodes to be spaced apart from each other to prevent a contact between the first and second electrodes, and suppress generation of parasitic capacitance between the first and second electrodes due to low permittivity.

In addition, since the piezoelectric layer is only formed on the flat surface of the first electrode, the piezoelectric layer may be firmly deposited on the first electrode, whereby the crystallinity of the piezoelectric layer may be increased.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
   a resonance part comprising a first electrode, a second electrode, and a piezoelectric layer disposed between the first and second electrodes, wherein the resonance part is disposed on a membrane layer;
   a substrate disposed below the resonance part; and
   a space enclosed by the piezoelectric layer, the first electrode, the second electrode and the membrane layer;
   wherein the piezoelectric layer is entirely disposed on a flat surface of the first electrode.

2. The acoustic resonator of claim 1, wherein an area of the piezoelectric layer is smaller than that of the flat surface of the first electrode.

3. The acoustic resonator of claim 1, wherein the space provides a separation between the first electrode and the second electrode.

4. The acoustic resonator of claim 1, wherein the space comprises an air cavity that separates the first electrode from the second electrode.

5. The acoustic resonator of claim 1, wherein the space is filled with an insulating material.

6. The acoustic resonator of claim 5, wherein the insulating material comprises at least one selected from the group consisting of $SiO_2$, silicon, $Si_3N_4$, and AlN.

7. The acoustic resonator of claim 1, further comprising at least one frame structure protruding outwardly from the second electrode.

8. The acoustic resonator of claim 1, wherein the membrane layer enclosing the space faces the second electrode enclosing the space.

9. An acoustic resonator comprising:
   a resonance part comprising a first electrode, a second electrode, and a piezoelectric layer disposed between the first and second electrodes, wherein the resonance part is disposed on a membrane layer;
   a substrate disposed below the resonance part; and
   a space enclosed by the piezoelectric layer, the first electrode, the second electrode and the membrane layer;
   wherein the first electrode comprises a first flat surface within the resonance part, a second flat surface outside the resonance part, and an inclined surface connecting the first flat surface and the second flat surface, and
   wherein the piezoelectric layer is entirely disposed on the first flat surface of the first electrode.

* * * * *